United States Patent
Giacomini

(10) Patent No.: US 6,784,733 B1
(45) Date of Patent: *Aug. 31, 2004

(54) DYNAMICALLY CONTROLLED AMPLIFIER

(75) Inventor: Joseph D. Giacomini, Loveland, CO (US)

(73) Assignee: Fairchild Semiconductor Corporation, South Portland, ME (US)

(*) Notice: Subject to any disclaimer, the term of this patent is extended or adjusted under 35 U.S.C. 154(b) by 89 days.

This patent is subject to a terminal disclaimer.

(21) Appl. No.: 10/301,375

(22) Filed: Nov. 20, 2002

Related U.S. Application Data

(63) Continuation of application No. 09/925,212, filed on Aug. 1, 2001, now Pat. No. 6,509,794.
(60) Provisional application No. 60/223,688, filed on Aug. 8, 2000.

(51) Int. Cl.[7] .................................................. H03F 3/45
(52) U.S. Cl. ........................................ 330/252; 327/55
(58) Field of Search ............................. 327/52, 55, 65, 327/563; 330/252, 250, 253, 254

(56) References Cited

U.S. PATENT DOCUMENTS

| | | | | |
|---|---|---|---|---|
| 4,335,358 A | | 6/1982 | Hoeft | 330/255 |
| 4,555,673 A | | 11/1985 | Huijsing et al. | 330/258 |
| 5,162,751 A | | 11/1992 | Blanken et al. | 330/257 |
| 5,294,892 A | | 3/1994 | Ryat | 330/253 |
| 5,311,145 A | | 5/1994 | Huijsing et al. | 330/255 |
| 5,414,388 A | | 5/1995 | Sauer | 330/252 |
| 5,440,273 A | | 8/1995 | Gusinov et al. | 330/267 |
| 5,521,553 A | | 5/1996 | Butler | 330/265 |
| 5,734,296 A | | 3/1998 | Dotson et al. | 330/253 |
| 5,739,722 A | * | 4/1998 | Ling | 330/253 |
| 5,786,731 A | | 7/1998 | Bales | 330/267 |
| 5,798,673 A | * | 8/1998 | Griffith et al. | 330/255 |
| 5,929,705 A | * | 7/1999 | Zhang et al. | 330/253 |
| 6,121,836 A | * | 9/2000 | Vallencourt | 330/253 |
| 6,150,883 A | * | 11/2000 | Ivanov | 330/253 |
| 6,281,753 B1 | * | 8/2001 | Corsi et al. | 330/258 |
| 6,304,141 B1 | * | 10/2001 | Kennedy et al. | 330/253 |
| 6,310,495 B1 | * | 10/2001 | Zhang | 327/108 |

OTHER PUBLICATIONS

U.S. patent application Ser. No. 09/712,322, Smith, filed Nov. 14, 2000.
U.S. patent application Ser. No. 09/878,477, Smith, filed Jun. 11, 2001.
U.S. patent application Ser. No. 60/223,688, Giacomini, filed Aug. 8, 2000.

* cited by examiner

*Primary Examiner*—Timothy P. Callahan
*Assistant Examiner*—Cassandra Cox
(74) *Attorney, Agent, or Firm*—Sidley Austin Brown & Wood LLP

(57) ABSTRACT

A dynamically controlled amplifier circuit includes a first difference circuit having a first primary differential amplifier and a first crossover differential amplifier running in parallel with the first primary differential amplifier. A second difference circuit has a second primary differential amplifier and a second crossover differential amplifier running in parallel with the second primary differential amplifier. An input terminal is coupled to control electrodes of the first primary differential amplifier and to control electrodes of the second primary differential amplifier. An output terminal of the first primary differential amplifier is coupled to control electrodes of the second crossover differential amplifier, and an output terminal of the second primary differential amplifier is coupled to control electrodes of the first crossover differential amplifier.

18 Claims, 7 Drawing Sheets

DYNAMICALLY CONTROLLED AMPLIFIER

CROSS-REFERENCE TO RELATED APPLICATION

The present application is a continuation application of co-pending U.S. patent application Ser. No. 09/925,212, filed on Aug. 1, 2001, now U.S. Pat. No. 6,509,794 entitled "Systems For Rail-To-Rail Dynamically Controlled Amplifiers And Input Stages," which claims priority to U.S. Provisional Application Serial No. 60/223,688, filed on Aug. 8, 2000, both of which are assigned to the present Assignee and incorporated herein by reference in their entireties.

BACKGROUND

1. Field of the Invention

The invention generally relates to the field of amplifiers, and more particularly, to a dynamically controlled amplifier.

2. Background Information

With the logical progression toward lower voltage supplies and lower power electronics comes the need for analog components that can provide the same electrical performance as their older higher voltage counterparts. One extremely important aspect is the ability to handle voltage levels as close to and including each supply rail. This allows for maximum signal swing for a given supply voltage, which helps improve performance aspects of signal-to-noise ratio, linearity, and flexibility of interconnection.

U.S. Pat. No. 4,555,673 entitled "Differential Amplifier with Rail-to-Rail Input Capability and Controlled Transconductance," issued on Nov. 26, 1985 to Johan H. Huijsing and Rudy J. van de Plassche, discloses a circuit 100 that provides rail-to-rail operation while maintaining overall amplifier gain through indirect means. As shown in FIG. 1, such a circuit 100 includes two complementary difference amplifiers 102 and 104, where difference amplifier 102 consists of a differential pair of transistors $Q_1$ and $Q_2$, and difference amplifier 104 consists of a differential pair of transistors $Q_3$ and $Q_4$. Each differential amplifier may have an associated current source. The differential amplifiers are attached to a clamp device 106, formed by transistors $Q_N$ and $Q_P$.

When the voltage of the common mode input approaches the level of a supply voltage, one of the difference amplifiers, e.g. difference amplifier 102, can collapse its associated current source. In such a case, clamp device 106 shuts off that particular difference amplifier 102 and accordingly shuts down its normal output signals. The current from clamp device 106 is then rerouted to bias circuitry for the other difference amplifier, e.g. difference amplifier 104. The bias of difference amplifier 104 is therefore doubled, which in turn doubles that amplifier's gain and corrects for the loss of gain from the other difference amplifier 102. This is the case, however, only if the two complementary difference amplifier outputs are summed together.

One disadvantage to this configuration is that it can impose limitations on the down stream circuitry. Another disadvantage is the net change in input bias current. Typically the net change is around two to four times the value present when both difference amplifiers are in the "on" state. The shut down operation can cause a one hundred percent change in bias current. Increasing the bias for the opposite stage can increase that change by an additional one hundred to three hundred percent or more. With both difference amplifiers 102 and 104 in the "on" state their input bias currents, for bipolar devices, can partially cancel since they are of opposite polarity. When one side is shut off, the partial cancellation stops and becomes the full value of the "on" side's base current. By increasing the "on" side's bias current the base current will also go up.

U.S. Pat. No. 5,294,892 entitled "Two-stage Rail-to-Rail Class AB Operational Amplifier," issued Mar. 15, 1994 to Marc H. Ryat, discloses that the current source used to bias the complementary differential pairs is allowed to shut off. No provision is made to correct for the gain change that this causes.

U.S. Pat. No. 5,311,145 entitled "Combination Driver-Summing Circuit for Rail-to-Rail Differential Amplifier," issued May 10, 1994 to Johan H. Huijsing and John P. Tero, discloses a traditional input stage of an amplifier that can employ a scheme very similar to U.S. Pat. No. 4,555,673. This arrangement is simpler in its approach in that it may only have one differential pair on at a time. Since it can be implemented in CMOS (complementary metal oxide semiconductor), it may not suffer the input bias current shift, but it can impose some restrictions on down stream circuitry.

U.S. Pat. No. 5,414,388 entitled "Rail-to-Rail Operational Amplifier Input Stage," issued May 9, 1995 to Don R. Sauer, also discloses an input bias control method that is similar to U.S. Pat. No. 4,555,673. One similarity is that the current in the complementary differential pair can be turned up when the current falls in the other differential pair. One difference, however, is that the current drive to either input pair can be automatically shut off using an additional differential pair for each input pair. The secondary differential pairs can be used to channel the main bias current directly to their associated input pair, or to the current source circuitry for the opposite input differential pair. This stacking of stages can deeply cut into the available supply voltage which makes this scheme not preferable in very low voltage applications. This scheme also relies on a saturation effect to perform its functions, which can cause some recovery problems that may show up as undesirable anomalies or glitches in waveforms during switching transitions.

Accordingly, there is a need for an operational amplifier design that can improve upon the limitations of known amplifiers.

SUMMARY

The limitations of known systems have been substantially improved upon by the present invention.

According to an embodiment of the invention, a rail-to-rail dynamically controlled amplifier circuit comprises a first difference circuit and a second difference circuit. The first difference circuit includes a first primary pair of transistors, a first crossover pair of transistors running in parallel with the first primary pair of transistors, a first level shifting circuit wherein the output of the first primary pair is coupled to control electrodes of the first level shifting circuit, and a first current source coupled to the first primary pair of transistors and the first crossover pair of transistors. The second difference circuit includes a second primary pair of transistors, a second crossover pair of transistors running in parallel with the second primary pair of transistors, a second level shifting circuit wherein the output of the second primary pair is coupled to control electrodes of the second level shifting circuit, and a second current source coupled to the second primary pair of transistors and the second crossover pair of transistors.

This embodiment of the amplifier circuit further comprises an upper voltage supply and a lower voltage supply coupled to the first difference circuit and the second difference circuit, and a pair of input lines wherein the input lines are coupled to control electrodes of the first primary pair of transistors and control electrodes of the second primary pair of transistors. In addition, the first level shifting circuit is coupled to control electrodes of the second crossover pair of transistors, and the second level shifting circuit is coupled to control electrodes of the first crossover pair of transistors.

In accordance with another embodiment of the invention, a method for amplifying a rail-to-rail input signal begins by providing a differential amplifier circuit that includes a first primary differential amplifier, a first crossover differential amplifier,a second primary differential amplifier, and a second crossover differential amplifier, wherein the polarity of the first primary differential amplifier and the first crossover differential amplifier is opposite that of the second primary differential amplifier and the second crossover differential amplifier. The method then comprises receiving and amplifying an input differential signal with a voltage that fluctuates between a first value slightly above an upper supply rail and a second value slightly below a lower supply rail.

According to this embodiment, when the voltage of the input differential signal is within a middle region of operation, defined as a voltage region that is about midway between the upper supply rail and the lower supply rail but not relatively close to either supply rail, the method comprises amplifying the input differential signal through a first primary differential amplifier to produce a first amplified differential signal and amplifying the input differential signal through a second primary differential amplifier to produce a second amplified differential signal.

Further, when the voltage of the input differential signal is within a lower transition region of operation, defined as a voltage region closer to the lower supply rail than the middle region but still not relatively close to the lower supply rail, the method comprises amplifying the input differential signal through the first primary differential amplifier in combination with a first crossover differential amplifier to produce the first amplified differential signal and amplifying the input differential signal through the second primary differential amplifier to produce the second amplified differential signal.

And when the voltage of the input differential signal is within a lower supply region of operation, defined as a voltage region below the lower transition region that can include and exceed the lower supply rail, the method comprises amplifying the input differential signal through the first crossover differential amplifier to produce the first amplified differential signal and amplifying the input differential signal through the second primary differential amplifier to produce the second amplified differential signal.

Similarly, according to this embodiment when the voltage of the input differential signal is within an upper transition region of operation, defined as a voltage region closer to the upper supply rail than the middle region but still not relatively close to the upper supply rail, the method comprises amplifying the input differential signal through the first primary differential amplifier to produce the first amplified differential signal and amplifying the input differential signal through the second primary differential amplifier in combination with a second crossover differential amplifier to produce the second amplified differential signal.

Finally, when the voltage of the input differential signal is within an upper supply region of operation, defined as a voltage region above the upper transition region that can include and exceed the upper supply rail, the method comprises amplifying the input differential signal through the first primary differential amplifier to produce the first amplified differential signal and amplifying the input differential signal through the second crossover differential amplifier to produce the second amplified differential signal.

A technical advantage of the invention includes cross coupling the first primary differential amplifier to the second crossover differential amplifier, and the second primary differential amplifier to the first crossover differential amplifier. This cross coupling allows the crossover differential amplifiers to take over the function of providing first and second amplified differential signals whenever the first or second primary differential amplifier must be shut off. A primary differential amplifier must be shut off when its associated current source becomes saturated due to the voltage of the input differential signal approaching or moving past the upper or lower supply rail. Each crossover differential amplifier is driven by the primary differential amplifier of the complementary difference circuit, as both primary differential amplifiers cannot be shut off simultaneously. Other important technical advantages of the invention are readily apparent to one skilled in the art from the following figures, descriptions, and claims.

BRIEF DESCRIPTION OF THE DRAWINGS

For a more complete understanding of the invention and for further features and advantages, reference is now made to the following description taken in conjunction with the accompanying drawings, in which.

DETAILED DESCRIPTION

Figure 1:
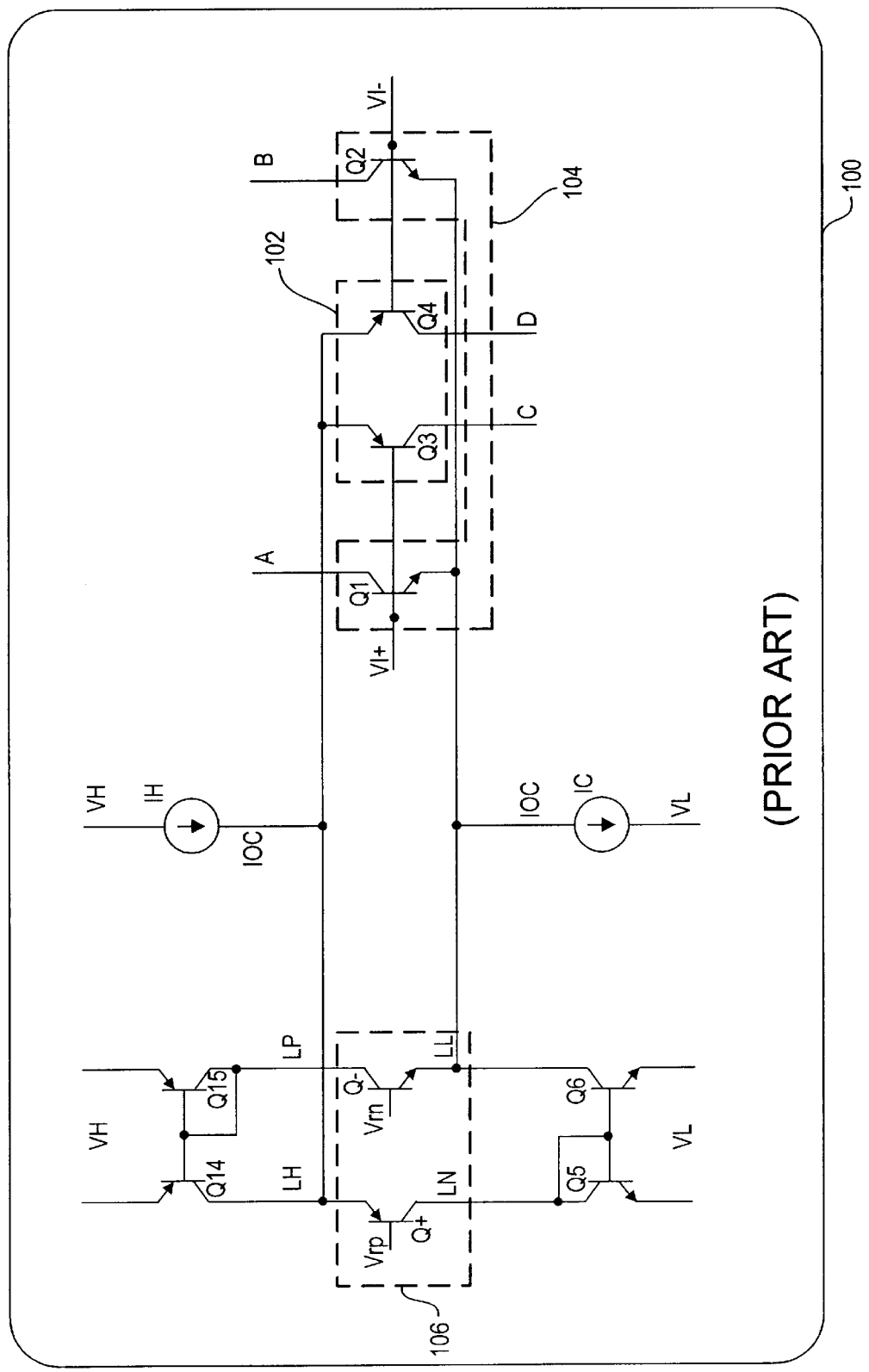
FIG. 1 is a schematic diagram of a known amplifier circuit.
Figure 2:
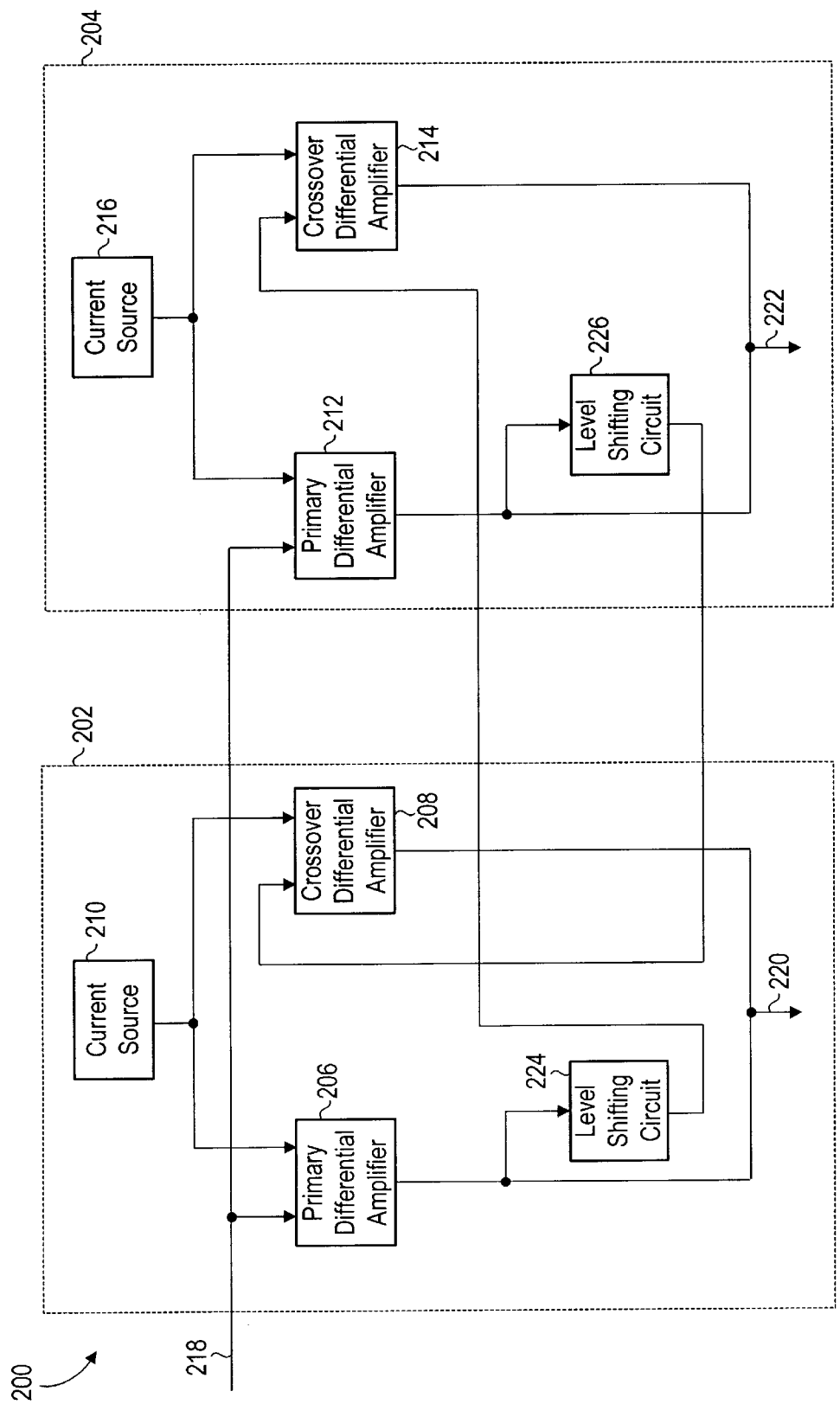
FIG. 2 is a block diagram of an amplifier circuit according to an embodiment of the invention.

The embodiments of the present invention and their advantages are best understood by referring to FIGS. 2 through 4 of the drawings. Like numerals are used for like and corresponding parts of the various drawings.

The invention provides a rail-to-rail operational amplifier and input stage which maintains nearly constant gain over a full supply common mode input change, while minimizing signal handling requirements of following stages and having minimal changes in bias currents drawn from external circuitry. A full supply common mode input change means that the voltage of the common mode input can fluctuate from just above an upper supply voltage to just below a lower supply voltage. The upper supply voltage is generally a positive voltage, and the lower supply voltage is generally a zero or ground voltage, or a negative voltage. For instance, the upper supply voltage can be +2.7V while the lower supply voltage is 0V. Alternately, the upper supply voltage can be +1.35V while the lower supply voltage is −1.35V. It should be noted that these voltages are provided only as examples and should not be construed as imposing limitations on the invention. Many different combinations of upper and lower supply voltages are possible. As used herein, the terms "upper rail" and "upper supply rail" refer to the upper supply voltage, and the terms "lower rail" and "lower supply rail" refer to the lower supply voltage. Furthermore, as used herein the term "$V_{CC}$" references the upper supply voltage, and the term "$V_{EE}$" references the lower supply voltage.

The invention utilizes complementary difference circuits having opposite polarity primary differential amplifiers that provide the majority of the amplification functionality. Each difference circuit further includes opposite polarity crossover differential amplifiers that assist or take over the amplification function when the value of the common mode input approaches the level of either supply rail. The invention can dynamically drive the crossover differential amplifier in each difference circuit using the output of the opposite polarity primary differential amplifier from the complementary difference circuit. In other words, the crossover differential amplifier of the first difference circuit can be driven by the output of the second difference circuit, and vice versa. This cross-coupling provides continuous operation of each difference circuit. The following stages may see very little change in bias level or signal swings while the input common mode voltage is changed from below the lower supply rail to above the upper supply rail. This is an improvement over known systems where the common mode voltage change of the input signals would often cause single differential amplifier circuits to saturate their associated bias current sources, or might require the use of a clamp and other circuit manipulation to correct for the inherent gain changes.

FIG. 2 is a block diagram of an amplifier circuit 200 constructed according to an embodiment of the invention. Amplifier circuit 200 is made up of two opposite polarity difference circuits, an n-type difference circuit 202 and a p-type difference circuit 204. Difference circuit 202 may utilize n-type transistors to form amplifier circuits, such as npn bipolar junction transistors or NMOS field effect transistors. Similarly, difference circuit 204 may utilize p-type transistors to form amplifier circuits, such as pnp bipolar junction transistors or PMOS field effect transistors.

As one skilled in the art will appreciate from the following description, difference circuits 202 and 204 are constructed in a similar fashion, wherein one difference circuit is substantially a mirror image of the other difference circuit. Of course, it will also be appreciated that the primary distinction between difference circuits 202 and 204 will always be their opposing polarities. So many if not all of the characteristics and elements of difference circuit 202 detailed herein are equally applicable to difference circuit 204.

Difference circuit 202 includes a primary differential amplifier 206 and a crossover differential amplifier 208. Both of these differential amplifiers receive current from a current source 210. Similarly, difference circuit 204 includes a primary differential amplifier 212 and a crossover differential amplifier 214, both of which receive current from a current source 216. An input line 218 routes input differential signals to both primary differential amplifiers 206 and 212. The output of primary differential amplifier 206 and crossover differential amplifier 208 may appear at output line 220, and the output of primary differential amplifier 212 and crossover differential amplifier 214 may appear at output line 222.

The output of primary differential amplifier 206 also feeds a level shifting circuit 224. Level shifting circuit 224 shifts the voltage of the output signal down to a lower voltage and then feeds this adjusted output signal to crossover differential amplifier 214. This voltage shifting function is done to provide an input to crossover differential amplifier 214 that keeps crossover differential amplifier 214 in a clean active region. Likewise, the output of primary differential amplifier 212 feeds a level shifting circuit 226 which shifts the voltage of that output signal up to a higher voltage, and then feeds this adjusted output signal to crossover differential amplifier 208. Therefore, n-type crossover differential amplifier 208 is driven by the output of p-type primary differential amplifier 212, and p-type crossover differential amplifier 214 is driven by the output of n-type primary differential amplifier 206. The advantage of this cross coupling is illustrated in FIGS. 3A to 3E.

FIGS. 3A to 3E are illustrations of five regions of operation for amplifier circuit 200. All four differential amplifiers 206, 208, 212, and 214 are represented in block form in each of FIGS. 3A to 3E. A shaded block denotes that the differential amplifier is "active" during that particular region of operation, and a non-shaded block denotes that the differential amplifier is "inactive" during that region of operation. The shape of the blocks representing crossover differential amplifiers 208 and 214 was chosen to match what will be used in FIG. 4 below. FIGS. 3A to 3E also each include a chart that graphically illustrates a range for the common mode input voltage during that region of operation, as it is the common mode input voltage that defines these five regions of operation.

Figure 3A:
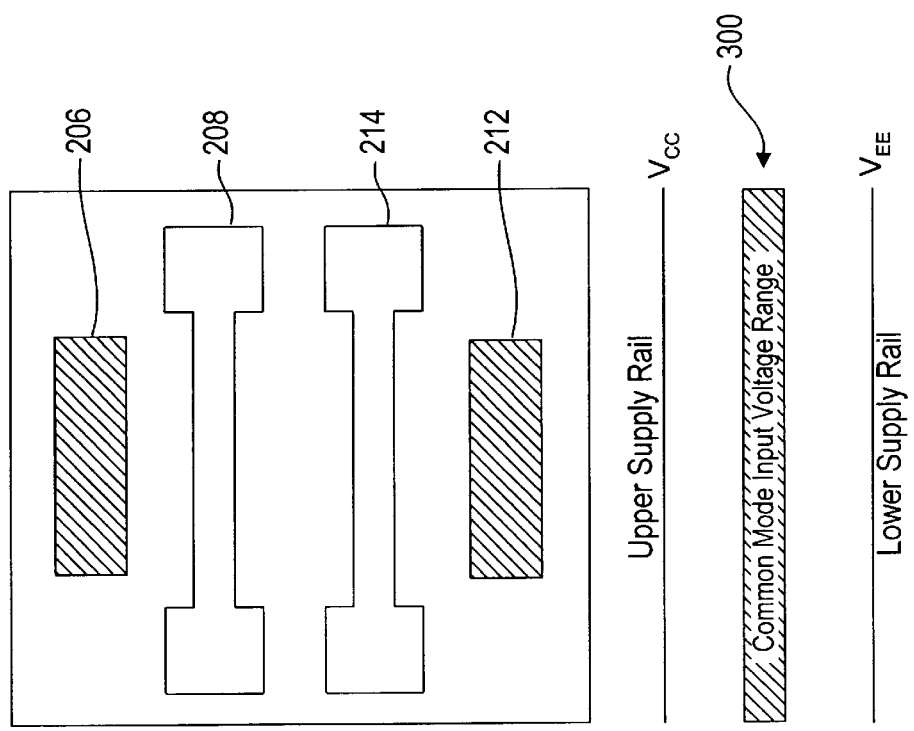
FIGS. 3A to 3E are illustrations of five modes of operation for the amplifier circuit of the invention.

FIG. 3A illustrates how amplifier circuit 200 functions when the common mode input voltage is within what is herein referred to as a middle region of operation. This middle region is defined as a voltage region about midway between the upper supply rail and the lower supply rail, but not relatively close to either supply rail. For example, if the upper supply rail is at +2.7V and the lower supply rail is at 0.0V, the middle region can range from around +1.20V to around +1.50V. Again, these voltages are provided only as examples and should not be construed as imposing limitations on the invention. This middle region of operation for the common mode input voltage is illustrated by graph 300 in FIG. 3A.

In this middle region of operation, primary differential amplifiers 206 and 212 are active while crossover differential amplifiers 208 and 214 are inactive. Since the common mode voltage is not near either supply rail, neither primary differential amplifier is in danger of saturating its associated bias current source. Therefore both primary differential amplifiers can operate without interruption similar to conventional differential amplifiers. Thus, primary differential amplifier 206 provides a continuous n-type output signal, and primary differential amplifier 212 provides a continuous p-type output signal.

Figure 3C:
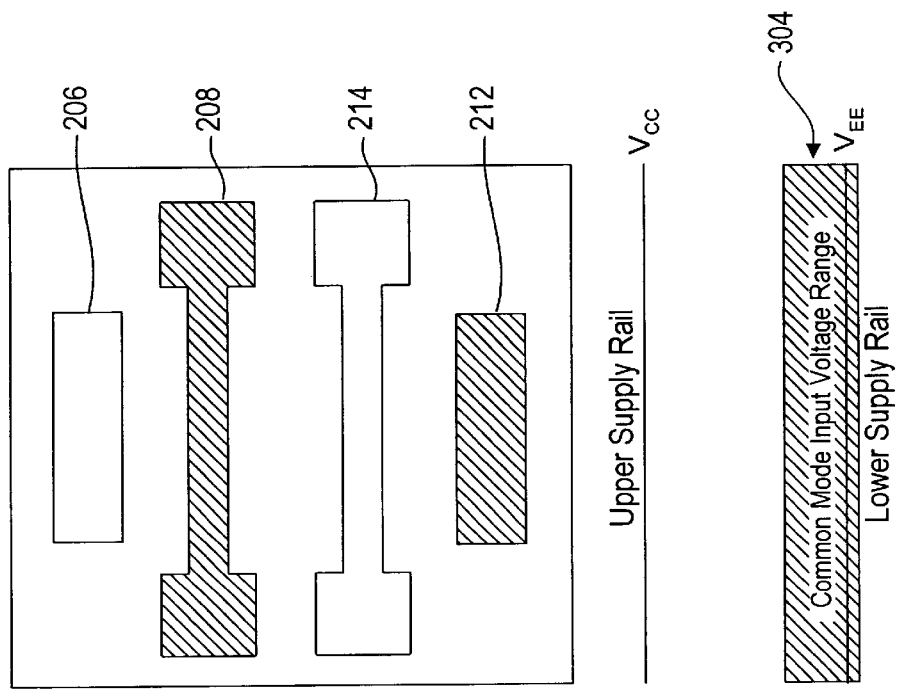
Figure 3B:
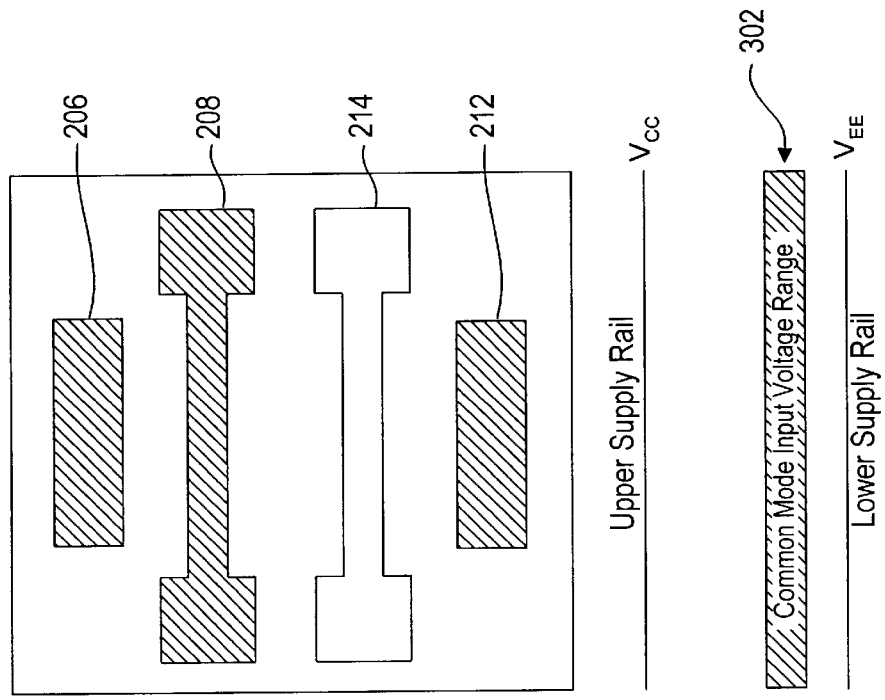

FIG. 3B illustrates how amplifier circuit 200 functions when the common mode input voltage is located within what is herein referred to as a lower transition region of operation. This lower transition region is defined as a voltage region that is closer to the lower supply rail than the middle region but is still not relatively close to the lower supply rail. The common mode input voltage will therefore tend to have a value here that is lower than any values associated with the middle region. For example, if the upper supply rail is at +2.7V and the lower supply rail is at 0.0V, the lower transition region can range from around +0.90V to around +1.20V. Again, these voltages are provided only as examples and should not be construed as imposing limitations on the invention. This lower transition region of operation for the common mode input voltage is illustrated by graph 302 in FIG. 3B.

In this lower transition region of operation, primary differential amplifiers 206 and 212 are active, crossover differential amplifier 208 is active, and crossover differential amplifier 214 is inactive. Since the common mode voltage is now closer to the lower supply rail, there is an increased likelihood that primary differential amplifier 206 will saturate its associated bias current source. Therefore crossover differential amplifier 208 is now used in combination with primary differential amplifier 206 to provide and maintain a continuous n-type output signal. To drive crossover differential amplifier 208, the output signal of primary differential amplifier 212 is used. This is because primary differential amplifier 212 is not in danger of being shut down in this instance (i.e. when the lower supply rail is approached), and therefore can provide an output signal capable of driving crossover differential amplifier 208. This output signal from primary differential amplifier 212 can be level shifted prior to driving crossover differential amplifier 208, using level shifting circuit 226 as indicated above.

FIG. 3C illustrates how amplifier circuit 200 functions when the common mode input voltage is located within what is herein referred to as a lower supply region of operation. This lower supply region is defined as a voltage region that is below the lower transition region and can include and exceed the lower supply rail. The common mode input voltage will therefore tend to have a value here that is less than any values associated with the lower transition region. For example, if the upper supply rail is at +2.7V and the lower supply rail is at 0.0V, the lower supply region can range from around −0.25V to around +0.90V. Again, these voltages are provided only as examples and should not be construed as imposing limitations on the invention. This lower supply region of operation for the common mode input voltage is illustrated by graph 304 in FIG. 3C.

In this lower supply region of operation, primary differential amplifier 212 is active, crossover differential amplifier 208 is active, primary differential amplifier 206 is inactive, and crossover differential amplifier 214 is inactive. Since the common mode voltage is around and even below the lower supply rail, primary differential amplifier 206 is shut off to prevent it from collapsing its associated bias current source. Therefore crossover differential amplifier 208 is now solely used to provide a continuous n-type output signal. Again, because primary differential amplifier 212 is not shut down in this instance, the output signal of primary differential amplifier 212 drives crossover differential amplifier 208.

Figure 3E:
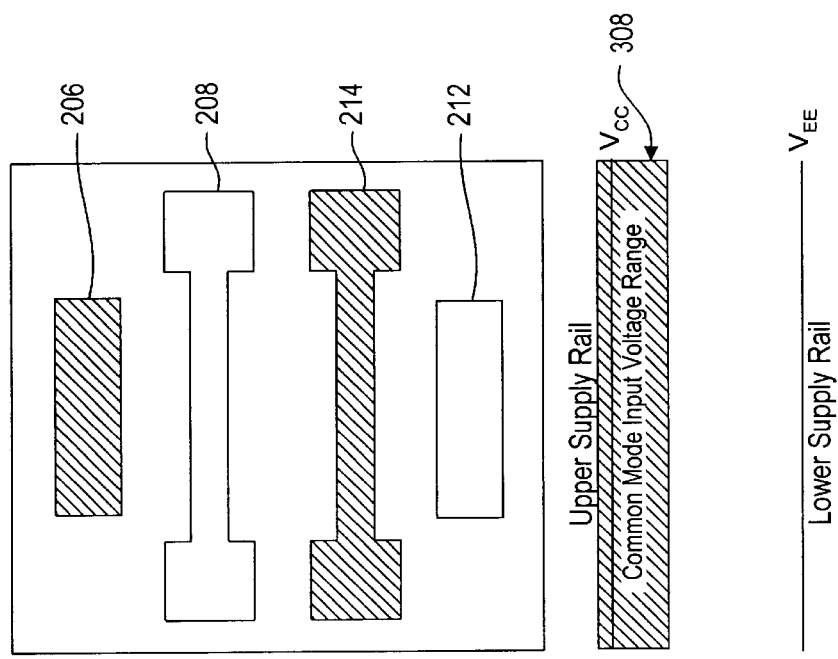
Figure 3D:
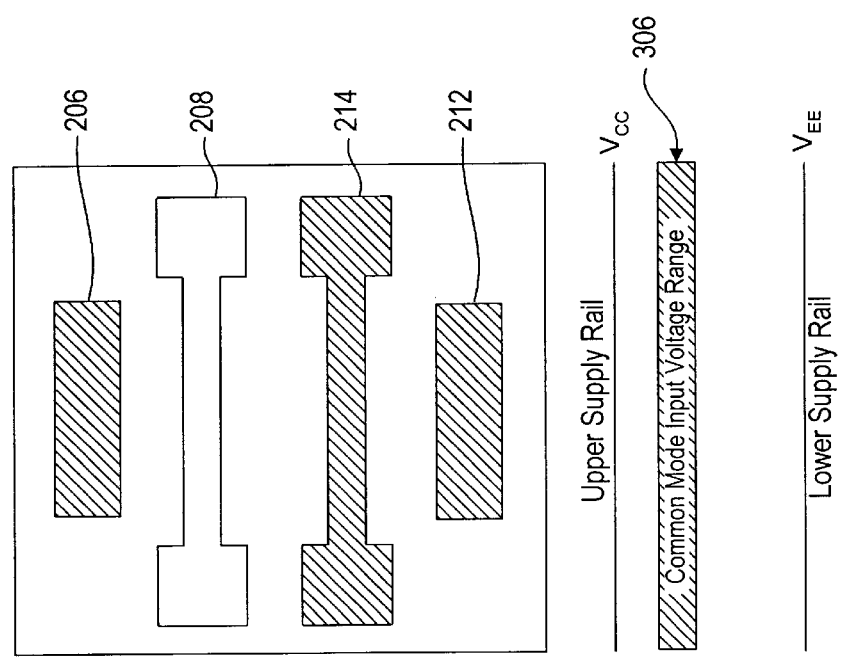

FIG. 3D illustrates how amplifier circuit 200 functions when the common mode input voltage is located within what is herein referred to as an upper transition region of operation. This upper transition region is defined as a voltage region that is closer to the upper supply rail than the middle region but is still not relatively close to the upper supply rail. The common mode input voltage will therefore tend to have a value here that is higher than any values associated with the middle region. For example, if the upper supply rail is at +2.7V and the lower supply rail is at 0.0V, the upper transition region can range from around +1.50V to around +1.80V. Again, these voltages are provided only as examples and should not be construed as imposing limitations on the invention. This upper transition region of operation for the common mode input voltage is illustrated by graph 306 in FIG. 3D.

In this upper transition region of operation, primary differential amplifiers 206 and 212 are active, crossover differential amplifier 214 is active, and crossover differential amplifier 208 is inactive. Since the common mode voltage is now closer to the upper supply rail, there is an increased likelihood that primary differential amplifier 212 will saturate its associated bias current source. Therefore crossover differential amplifier 214 is used in combination with primary differential amplifier 212 to provide and maintain a continuous p-type output signal. And because primary differential amplifier 206 is not in danger of being shut down in this instance (i.e. when the upper supply rail is approached), it is the output signal of primary differential amplifier 206 that drives crossover differential amplifier 214. Again, the output signal of primary differential amplifier 206 can be level shifted by level shifting circuit 224 prior to driving crossover differential amplifier 214.

Finally, FIG. 3E illustrates how amplifier circuit 200 functions when the common mode input voltage is located within what is herein referred to as an upper supply region of operation. This upper supply region is defined as a voltage region that is above the upper transition region and can include and exceed the upper supply rail. The common mode input voltage will therefore tend to have a value here that is greater than any values associated with the upper transition region. For example, if the upper supply rail is at +2.7V and the lower supply rail is at 0.0V, the upper supply region can range from around +1.80V to around +2.95V. Again, these voltages are provided only as examples and should not be construed as imposing limitations on the invention. This upper supply region of operation for the common mode input voltage is illustrated by graph 308 in FIG. 3E.

In this upper supply region of operation, primary differential amplifier 206 is active, crossover differential amplifier 214 is active, primary differential amplifier 212 is inactive, and crossover differential amplifier 208 is inactive. Since the common mode voltage is around and even exceeds the upper supply rail, primary differential amplifier 212 is shut off to prevent it from collapsing its associated bias current source. Therefore crossover differential amplifier 214 is now solely used to provide a continuous p-type output signal. Again, because primary differential amplifier 206 is not shut down in this instance, the output signal of primary differential amplifier 206 drives crossover differential amplifier 214.

Figure 4A:
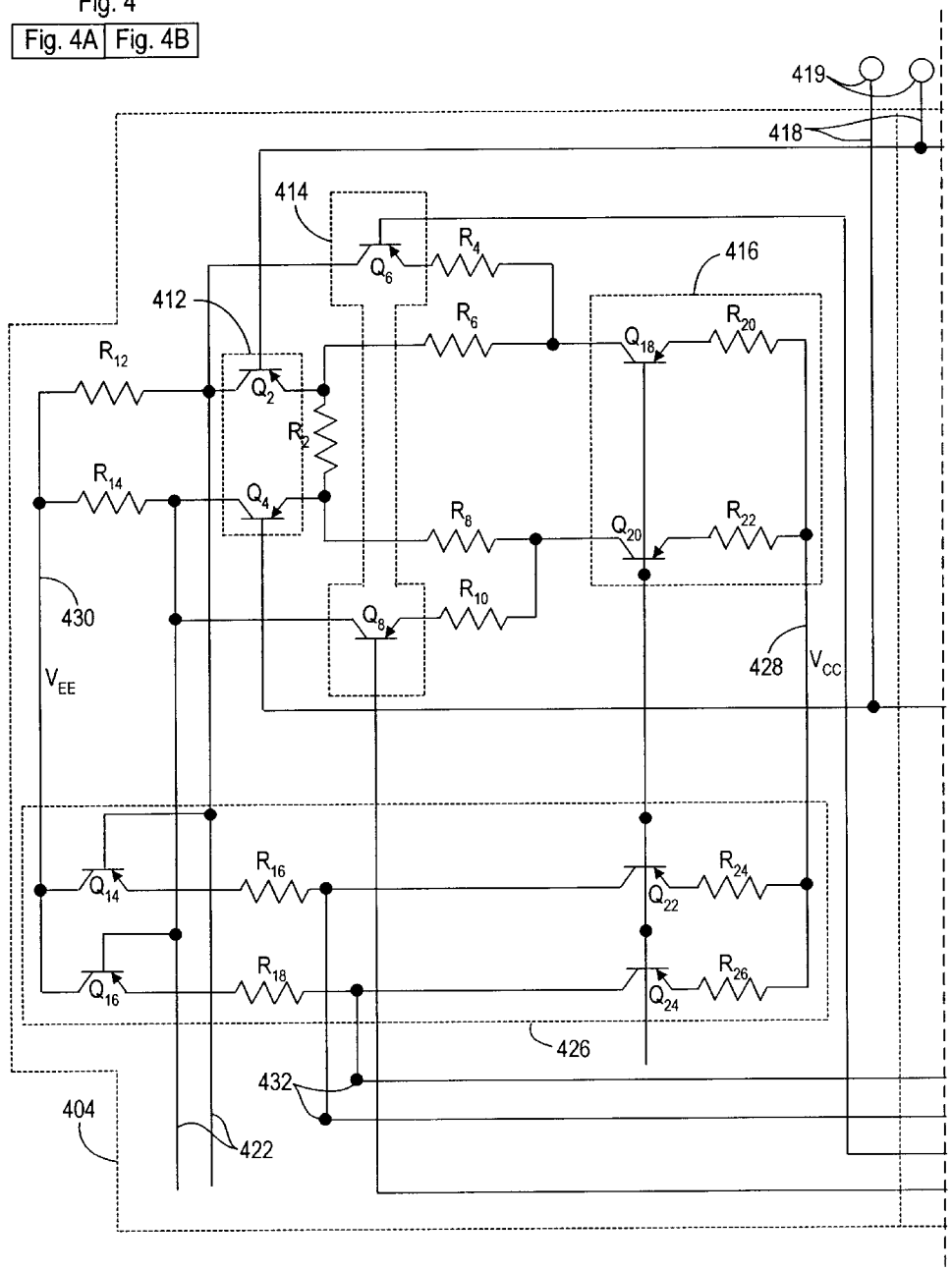
FIGS. 4A and 4B are a schematic diagram of an amplifier circuit constructed in accordance with an embodiment of the invention.
Figure 4B:
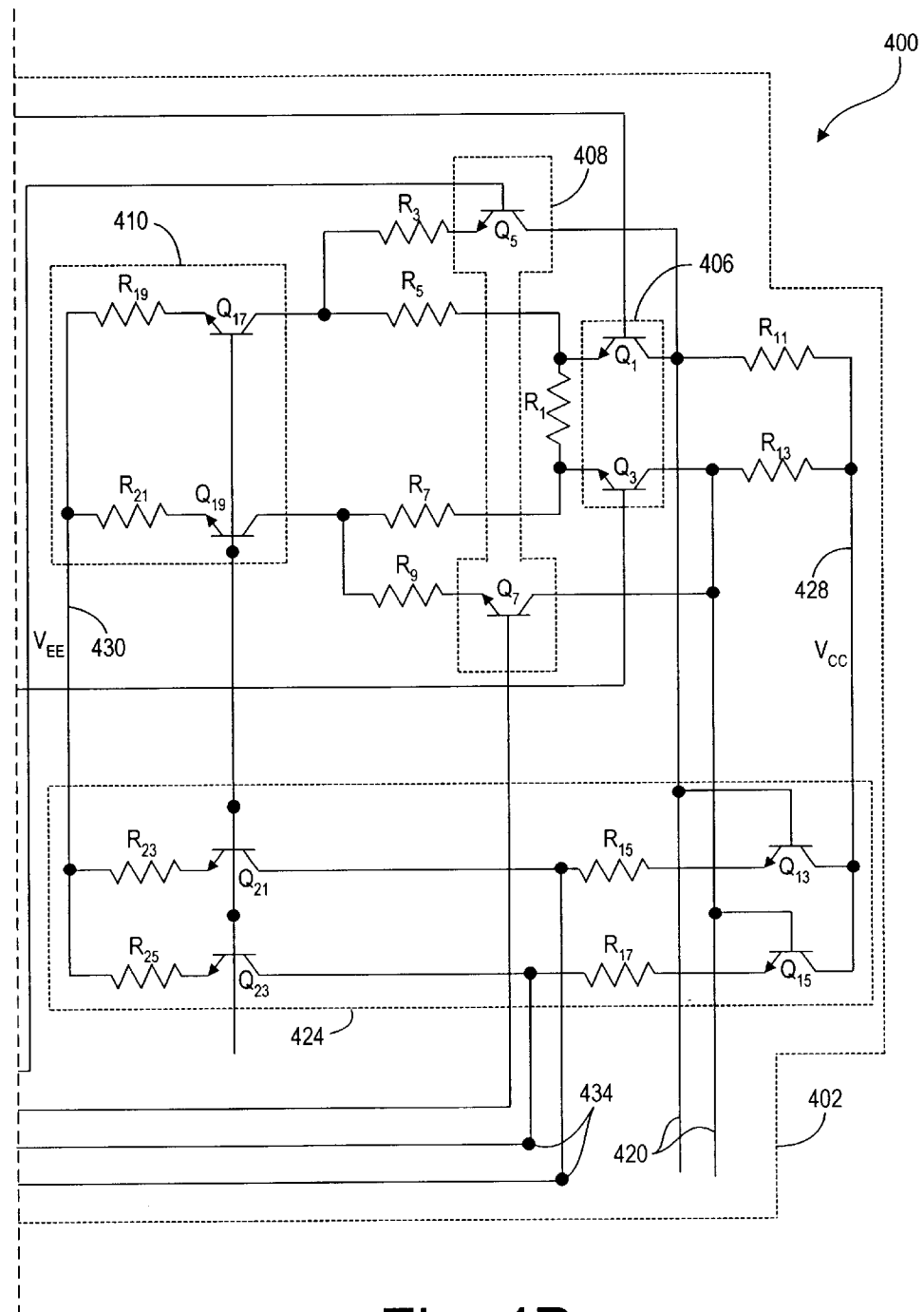

FIGS. 4A and 4B (collectively referred to as "FIG. 4") are a schematic diagram of an amplifier circuit 400 that is an exemplifying implementation of amplifier circuit 200 according to an embodiment of the invention. As shown, amplifier circuit 400 utilizes bipolar junction transistors and can by formed by a comple-mentary bipolar process. It should be noted, however, that any of a variety of transistors can be used in other implementations of amplifier circuit 200, including but not limited to bipolar junction transistors or field effect transistors. Thus, the invention should not be construed as being limited to the use of bipolar junction transistors as shown in FIG. 4.

In the embodiment shown in FIG. 4, amplifier circuit 400 includes two complementary difference circuits, an npn side difference circuit 402, and a pnp side difference circuit 404. Each difference circuit 402 and 404 in turn includes two parallel differential amplifier pairs. For npn side difference circuit 402, those two parallel differential amplifier pairs are an npn primary differential amplifier pair 406 and an npn crossover differential amplifier pair 408. Npn primary differential amplifier pair 406 comprises transistors $Q_1$ and $Q_3$, while npn crossover differential amplifier pair 408 comprises transistors $Q_5$ and $Q_7$. And for pnp side difference circuit 404, its parallel differential amplifier pairs are a pnp primary differential amplifier pair 412 and a pnp crossover differential amplifier pair 414. Pnp primary differential amplifier pair 412 comprises transistors $Q_2$ and $Q_4$, and pnp crossover differential amplifier pair 414 comprises transistors $Q_6$ and $Q_8$.

Primary differential amplifier pairs 406 and 412 are coupled to input lines 418 which carry an input differential signal. As shown in FIG. 4, it is base electrodes of the transistors forming primary differential amplifier pairs 406 and 412 that actually receive the input differential signal. Input pins 419 are typically used to connect amplifier 400 to the source of the input differential signal. Each primary differential amplifier pair 406 and 412 also has its emitter electrodes coupled together, either directly or through degeneration resistors $R_1$ and $R_2$, as shown in FIG. 4. The emitter connection can employ a single current source or two current sources with a resistive connection between them.

The common points for primary differential amplifier pair 406 are connected to complementary crossover differential amplifier pairs 414 located in complementary difference circuit 404. Likewise, the common points for primary differential amplifier pair 412 are connected to complementary crossover differential amplifier 408 located in complementary difference circuit 402. The connections between primary differential amplifier pairs 406 and 412 to crossover differential amplifier pairs 414 and 408 are either through direct or resistive means.

As mentioned above, primary differential amplifier pair 406 is connected parallel to crossover differential amplifier pair 408, and primary differential amplifier pair 412 is connected parallel to crossover differential amplifier pair 414. More specifically, collector electrodes of each primary differential amplifier pair 406 and 412 are coupled to collector electrodes of their respective crossover differential amplifier pairs 408 and 414. The use of a parallel construction allows each difference circuit 402 and 404 to have a single differential output. Accordingly, as shown in FIG. 4, the parallel n-type differential output of primary differential amplifier pair 406 and crossover differential amplifier pair 408 is found on output lines 420, and the parallel p-type differential output of primary differential amplifier pair 412 and crossover differential amplifier pair 414 is found on output lines 422. Output lines 420 and 422 are connected to either resistive or current source loads that are referenced to either the upper voltage supply or the lower voltage supply for n-type and p-type difference amplifiers respectfully. Resistive loads can allow for the widest common mode range possible for amplifier 400.

Difference circuits 402 and 404 are constructed in a similar fashion to one another. For instance, npn primary differential amplifier pair 406 has degeneration provided by resistor $R_1$, and has its output and gain taken off resistors $R_{11}$ and $R_{13}$ (i.e. output lines 420). Similarly, pnp primary differential amplifier pair 412 has degeneration provided by resistor $R_2$, and has its output and gain taken off resistors $R_{12}$ and $R_{14}$ (i.e. output lines 422). Accordingly, many if not all of the characteristics and elements of npn side difference circuit 402 detailed herein are equally applicable to pnp side difference circuit 404.

According to an embodiment, a current source 410 for npn side difference circuit 402 can be formed by two transistors $Q_{17}$ and $Q_{19}$ along with their respective resistors $R_{19}$ and $R_{21}$. In normal operation, a pair of resistors $R_5$ and $R_7$ will have no effect on the operation of primary differential amplifier pair 406. A completely complementary current source 416 can be employed for pnp side difference circuit 404 formed by transistors $Q_{18}$ and $Q_{20}$ and resistors $R_{20}$ and $R_{22}$. In alternative embodiments, current sources 410 and 416 can be formed by any of a number of alternate circuit configurations.

With the proper selection of circuit values, the collector voltages of transistors $Q_1$ and $Q_3$ that form primary differential amplifier pair 406 may nominally be only a small fraction of a volt below an upper supply voltage $V_{CC}$, wherein the upper supply voltage $V_{CC}$ is provided by upper voltage supplies 428. Likewise, the collector voltages of transistors $Q_2$ and $Q_4$ that form primary differential amplifier pair 412 may be only a small fraction of a volt above a lower supply voltage $V_{EE}$, wherein the lower supply voltage $V_{EE}$ is provided by lower voltage supplies 430. This allows the respective base voltages of transistors $Q_1$ and $Q_3$, or transistors $Q_2$ and $Q_4$, to be brought slightly above or below the supply rail without saturating the associated transistors.

One aspect to maintaining the overall gain concerns how primary differential amplifier pairs 406 and 412 are connected to their corresponding crossover differential amplifier pairs 408 and 414. Primary differential amplifier pairs 406 and 412 can convert an input differential voltage signal present on input lines 418 into a differential current with a gain that is controlled primarily by the bias current level for bipolar technologies and by device geometry for CMOS devices. This current signal can then be reconverted back to a voltage by the effective load resistance.

To obtain optimal noise and offset performance, the net gain is preferably greater than one. It can typically be anywhere from three to fifty times the input voltage. In embodiments of the invention, lower gains can be used on primary differential amplifier pairs 406 and 412 to reduce complications in feeding the output back to crossover differential amplifier pairs 408 and 414. If crossover differential amplifier pairs 408 and 414 have the same degeneration as primary differential amplifier pairs 406 and 412, they can produce a gain to their respective outputs that is equal to the gain that primary differential amplifier pairs 406 and 412 can produce when they become fully active.

The net gain through this path can be the main input gains, from complementary primary differential amplifier pairs 406 and 412, squared. To reduce these gains, crossover differential amplifier pairs 408 and 414 may be degenerated by an amount sufficient to reduce their gain to unity. There are different methods to reduce the gain of the feedback path but the use of degeneration can maintain the same small signal gain and still provides the same large signal swing that primary differential amplifier pairs 406 and 412 would provide. This can be important to decoupling the input stage changes from the latter stage bias conditions. This can also become critical in low voltage applications.

When the common mode voltages present on input lines 418 are brought toward a lower supply rail, crossover differential amplifier pair 408 and resistors $R_3$, $R_5$, $R_7$ and $R_9$ start to come into play. Current from current source 410 can begin to flow into crossover differential amplifier pair 408 when the common mode input voltage approaches the common mode voltage present on nodes 432. Crossover differential amplifier pair 408 therefore assists primary differential amplifier pair 406 in providing an output signal on output lines 420. This arrangement of resistors and multiple current sources can be used to maximize the overall headroom for primary differential amplifier pair 406 or 412 and crossover differential amplifier pair 408 or 414.

When the common mode input voltage present on input lines 418 reaches its most lower extreme, primary differential amplifier pair 406 shuts off and all of the current provided by current source 410 can flow into crossover differential amplifier pair 408. This current can then be channeled to the output of the stage at resistors $R_{11}$ and $R_{13}$ (i.e. output lines 420). So crossover differential amplifier pair 408 now solely provides an output signal on output lines 420. Drive signals for the bases of transistors $Q_5$ and $Q_7$ that form crossover differential amplifier pair 408 are derived from the output of pnp side difference circuit 404, which will be in an active state for input signals at or even below the lower supply rail, shown as $V_{EE}$ in the circuit of FIG. 4. The output of pnp side difference circuit 404 can be level shifted by a level shifting circuit 426, which in this embodiment is formed by transistors $Q_{14}$ and $Q_{16}$ and resistors $R_{16}$ and $R_{18}$ combined with a current source that is formed by transistors $Q_{22}$ and $Q_{24}$ and resistors $R_{24}$ and $R_{26}$. This level shifted voltage can be set to maximize the input range for primary differential amplifier pair 406 while preventing current source 410 from saturating when primary differential amplifier pair 406 is shut off. In alternative embodiments, level shifting circuit 426 can be formed using alternate circuit configurations.

Thus, crossover differential amplifier pair 408 of npn side difference circuit 402 can be driven by the output signal of pnp side difference circuit 404. This output signal is proportional to the main input voltage present on input lines 418. The degeneration on crossover differential amplifier pair 408 can be much larger than primary differential amplifier pair 406 to correct for the added gain of pnp side difference circuit 404. The net degeneration resistance of such an arrangement can be the sum of resistors $R_1$, $R_3$, $R_5$, $R_7$, and $R_9$, and can be selected to give a net gain to the output for npn side difference circuit 402 that is equal to what would have been produced by primary differential amplifier pair 406 if they were in their active mode. The net result can be that both the gain and actual voltage levels present on output lines 420 can be maintained even when primary differential amplifier pair 406 is shut off.

A completely symmetrical situation exists for the complementary pnp side difference circuit 404 where its output can be maintained even for input voltage signals at or slightly above the upper supply rail. When the common mode voltages present on input lines 418 are brought toward an upper supply rail, crossover differential amplifier pair 414 and resistors $R_4$, $R_6$, $R_8$ and $R_{10}$ now come into play. Current from current source 416 can begin to flow into crossover differential amplifier pair 414 when the common mode input voltage approaches the common mode voltage present on nodes 434. Crossover differential amplifier pair 414 thereby assists primary differential amplifier pair 412 in providing an output signal on output lines 422.

Then when the input voltages present on input lines 418 move to their most upper extreme, primary differential amplifier 412 shuts off and all of the current provided by current source 416 can flow into crossover differential amplifier pair 414. This current can then be channeled to the output of the stage at $R_{12}$ and $R_{14}$ (i.e. output lines 422). So crossover differential amplifier pair 414 now solely provides an output signal on output lines 422. Drive signals for the bases of transistors $Q_6$ and $Q_8$ that form crossover differential amplifier pair 414 can be derived from the output of npn side difference circuit 402, which will be in an active state for input voltage signals at or even above the upper supply voltage level $V_{CC}$. The output of npn side difference circuit 402 can be level shifted by a level shifting circuit 424, which in this embodiment is formed by transistors $Q_{13}$ and $Q_{15}$ and resistors $R_{15}$ and $R_{17}$ combined with a current source formed by transistors $Q_{21}$ and $Q_{23}$ and resistors $R_{23}$ and $R_{25}$. This level shifted voltage can be set to maximize the input range for primary differential amplifier pair 412 while preventing current source 416 from saturating when primary differential amplifier pair 412 is shut off. In alternative embodiments, level shifting circuit 424 can be formed using alternate circuit configurations.

Accordingly, crossover differential amplifier pair 414 of pnp side difference circuit 404 can be driven by the output signal of npn side difference circuit 402. This output signal is proportional to the main input voltage present on input lines 418. The degeneration on crossover differential amplifier pair 414 can be much larger than primary differential amplifier pair 412 to correct for the added gain of npn side difference circuit 402. The net degeneration resistance of such an arrangement can be the sum of resistors $R_2$, $R_4$, $R_6$, $R_8$, and $R_{10}$, and can be selected to give a net gain to the output for pnp side difference circuit 404 that is equal to what would have been produced by primary differential amplifier pair 412 if they were in their active mode. The net result can be that both the gain and actual voltage levels present on output lines 422 can be maintained even when primary differential amplifier pair 412 is shut off.

The invention can maintain all of the static and dynamic characteristics of slewrate, bandwidth, offset, open loop gain, and noise rejection while allowing both primary differential amplifier pairs 406 and 412 and common mode differential input voltages to be driven below the lower rail and above the upper rail simultaneously. The topology used to perform this task can be implemented in either complementary bipolar or complementary metal oxide semiconductor (CMOS) process technologies.

During the transition from primary differential amplifier pair activity to crossover differential amplifier pair activity, the net gain can be a combination of the primary and crossover differential amplifier pairs. By properly selecting current levels and resistor values, the transition can be made very smoothly. Even with the small variations in gain that can occur, the total available slewing current can remain relatively constant and thus one important aspect of amplifier 400 is unaffected. The sensitivity of the gain variations can be very low given the fact that amplifier 400 can be used in closed loop configuration where any excess gain can simply reduce input and output impedances and signal distortion. The variation can easily be a small fraction of a decibel, usually on the order of a few percent.

In an embodiment of the invention, the output of at least one of primary differential amplifier pairs 406 or 412 is connected to the control terminal of a device, of the same polarity as the associated primary differential amplifier pair 406 or 412, which has its emitter electrode biased up from a current source connected to the opposite rail as the resistive loads. The connection to the current source can be either direct or through a resistor to form a level shifted version of the output of primary differential amplifier pair 406 or 412. The level shifted output is used to drive the crossover differential amplifier pair 408 or 414 in each difference circuit 402 or 404. The signals that are shifted up from the lower supply rail drive an n-type differential amplifier pair while the signals shifted down from the upper supply rail are used to drive a p-type differential amplifier pair. The implementation of this input circuit can be done using either bipolar or CMOS technologies.

In another embodiment of the invention, circuit 400 can be used as an operational amplifier input stage with a pair of differential input terminals and upper and lower supply rails connected to a source of operating power. In other embodiments, the invention can be incorporated into applications and devices in the telecommunications field (e.g. telephones, cellular phones, etc.).

In yet other embodiments of the invention, circuit 400 can be utilized as the input stage for various amplifiers, including but not limited to those such as disclosed in U.S. patent application Ser. No. 09/878,477, filed on Jun. 11, 2001 and entitled "Enhanced Slew-Rate in Amplifier Circuits," which is assigned to the assignee of the present invention and is hereby incorporated by reference. The invention can also be used as the input stage for low power systems, including but not limited to those such as disclosed in U.S. patent application Ser. No. 09/712,322, filed on Dec. 14, 2000 and entitled "Low Power Systems Using Enhanced Bias Control in Rail-to-Rail Gain Stage Amplifiers," which is also assigned to the assignee of the present invention and is hereby incorporated by reference as well. Similarly, the invention can be used as the input stage for comparators, data converters, and any other devices having analog inputs, regardless of whether the device has feedback.

The invention therefore utilizes techniques that maintain a variety of characteristics as well as techniques that allow both common mode differential input voltages to be driven below the lower supply rail and above the upper supply rail. The invention can be implemented in a variety of ways, two examples being implementation through complementary bipolar or CMOS process technologies.

Accordingly, systems and methods of the invention have been described for rail-to-rail dynamically controlled amplifiers and input stages. Unlike previously developed techniques in which the common mode voltage change of the input signals would often cause single differential amplifier pair circuits to saturate their associated bias current sources, or might require the use of a clamp and other circuit manipulation to correct for the inherent gain changes, when such input signals would approach a supply rail, the systems and methods of the present invention utilize complementary difference circuits that maintain functionality even when the input signal approaches or exceeds a supply rail. The invention does this by implementing a crossover differential amplifier to take over for the primary differential amplifier when the input signal approaches a supply rail. The crossover differential amplifier pair in each difference circuit is dynamically driven by the output of the opposite polarity primary differential amplifier pair in the complementary difference circuit, as only one primary differential amplifier pair will be affected by at a time. This cross-coupling can provide continuous operation of each difference circuit with following stages seeing very little change in bias level or signal swings when the input common mode voltage is changed from below the lower voltage supply to above the upper voltage supply.

While various embodiments of the invention have been shown and described, it will be apparent to those skilled in the art that numerous alterations may be made without departing from the inventive concepts presented herein. Thus, the invention is not to be limited except in accordance with the following claims and their equivalents.

What is claimed is:

1. A dynamically controlled amplifier circuit comprising:
   a first difference circuit having a first primary pair of transistors and a first crossover pair of transistors running in parallel with the first primary pair of transistors;
   a second difference circuit having a second primary pair of transistors and a second crossover pair of transistors running in parallel with the second primary pair of transistors; and
   an input terminal coupled to control electrodes of the first primary pair of transistors and to control electrodes of the second primary pair of transistors;
   wherein an output terminal of the first primary pair of transistors is coupled to control electrodes of the second crossover pair of transistors and an output terminal of the second primary pair of transistors is coupled to control electrodes of the first crossover pair of transistors.

2. The amplifier circuit of claim 1 further comprising a first level shifting circuit, wherein the output of the first primary pair of transistors is coupled to control electrodes of the first level shifting circuit, and the first level shifting circuit is coupled to the control electrodes of the second crossover pair of transistors.

3. The amplifier circuit of claim 2 further comprising a second level shifting circuit, wherein the output of the second primary pair of transistors is coupled to control electrodes of the second level shifting circuit, and the second level shifting circuit is coupled to the control electrodes of the first crossover pair of transistors.

4. The amplifier circuit of claim 1 further comprising an upper voltage supply coupled to the first difference circuit and the second difference circuit.

5. The amplifier circuit of claim 1 further comprising a lower voltage supply coupled to the first difference circuit and the second difference circuit.

6. The amplifier circuit of claim 1 further comprising an upper supply rail and a lower supply rail.

7. The amplifier circuit of claim 1 wherein the first primary pair of transistors and the second primary pair of transistors comprise bipolar junction transistors, and the amplifier circuit further comprises a first degeneration resistor coupled to emitter electrodes of the first primary pair of transistors, and a second degeneration resistor coupled to emitter electrodes of the second primary pair of transistors.

8. The amplifier circuit of claim 1 wherein the second primary pair of transistors and the second crossover pair of transistors comprise bipolar junction transistors, and a first current source is coupled to emitter electrodes of the second primary pair of transistors and emitter electrodes of the second crossover pair of transistors.

9. The amplifier circuit of claim 1 wherein the first difference circuit comprises a first resistor coupled to the first primary pair of transistors and the first crossover pair of transistors.

10. The amplifier circuit of claim 1 wherein the second difference circuit comprises a second resistor coupled to the second primary pair of transistors and the second crossover pair of transistors.

11. A dynamically controlled amplifier circuit comprising:
   a first difference circuit having a first primary differential amplifier and a first crossover differential amplifier running in parallel with the first primary differential amplifier;
   a second difference circuit having a second primary differential amplifier and a second crossover differential amplifier running in parallel with the second primary differential amplifier; and
   an input terminal coupled to control electrodes of the first primary differential amplifier and to control electrodes of the second primary differential amplifier;
   wherein an output terminal of the first primary differential amplifier is coupled to control electrodes of the second crossover differential amplifier and an output terminal of the second primary differential amplifier is coupled to control electrodes of the first crossover differential amplifier.

12. The amplifier circuit of claim 11 further comprising a first level shifting circuit coupled to the control electrodes of the second crossover differential amplifier, wherein the output terminal of the first primary differential amplifier is coupled to control electrodes of the first level shifting circuit.

13. The amplifier circuit of claim 11 further comprising a second level shifting circuit coupled to the control electrodes of the first crossover differential amplifier, wherein the output terminal of the second primary differential amplifier is coupled to control electrodes of the second level shifting circuit.

14. The amplifier circuit of claim 11 wherein the first difference circuit and the second difference circuit have opposite polarities.

15. The amplifier circuit of claim 11 further comprising:
a first voltage supply coupled to the first difference circuit and the second difference circuit; and
a second voltage supply coupled to the first difference circuit and the second difference circuit.

16. The amplifier circuit of claim 15 wherein the first voltage supply is at a higher voltage level than the second voltage supply.

17. The amplifier circuit of claim 11 further comprising:
a first current source coupled to the first primary differential amplifier and the first crossover differential amplifier; and
a second current source coupled to the second primary differential amplifier and the second crossover differential amplifier.

18. The amplifier circuit of claim 11 wherein the first difference circuit comprises a first resistor coupled to the first primary differential amplifier and the first crossover differential amplifier, and wherein the second difference circuit comprises a second resistor coupled to the second primary differential amplifier and the second crossover differential amplifier.

* * * * *